US007056639B2

(12) United States Patent
Hayakawa et al.

(10) Patent No.: US 7,056,639 B2
(45) Date of Patent: *Jun. 6, 2006

(54) IMAGEABLE COMPOSITION CONTAINING AN INFRARED ABSORBER WITH COUNTER ANION DERIVED FROM A NON-VOLATILE ACID

(75) Inventors: Eiji Hayakawa, Utsunomiya (JP);
Jianbing Huang, Trumbull, CT (US);
Thomas R. Jordan, Windsor, CO (US);
Yasushi Miyamoto, Tatebayashi (JP);
Jeffrey J. Collins, Greeley, CO (US);
Neil F. Haley, Wellington, CO (US);
John Kalamen, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/922,377

(22) Filed: Aug. 20, 2004

(65) Prior Publication Data

US 2005/0079439 A1    Apr. 14, 2005

Related U.S. Application Data

(63) Continuation-in-part of application No. 09/933,864, filed on Aug. 21, 2001, now Pat. No. 6,806,020, and a continuation-in-part of application No. 09/933,884, filed on Aug. 21, 2001, now Pat. No. 6,921,620.

(51) Int. Cl.
*G03F 7/21*     (2006.01)
*G03F 7/30*     (2006.01)

(52) U.S. Cl. .................. 430/157; 430/175; 430/176; 430/270.1; 430/302

(58) Field of Classification Search ............... 430/163, 430/175, 176, 270.1, 302, 157
See application file for complete search history.

(56) References Cited

U.S. PATENT DOCUMENTS

| | | |
|---|---|---|
| 3,359,109 A | 12/1967 | Harder et al. |
| 4,038,372 A | 7/1977 | Colli |
| 4,189,323 A | 2/1980 | Buhr |
| 4,228,232 A | 10/1980 | Rousseau |
| 4,248,959 A | 2/1981 | Jeffers et al. |
| 4,366,228 A | 12/1982 | Specht et al. |
| 4,410,621 A | 10/1983 | Wada et al. |
| 4,486,529 A | 12/1984 | Jeffers et al. |
| 4,511,645 A | 4/1985 | Koike et al. |
| 4,743,531 A | 5/1988 | Farid et al. |
| 4,906,551 A | 3/1990 | Herrmann |
| 4,937,159 A | 6/1990 | Gottschalk et al. |
| 4,940,647 A | 7/1990 | Frommeld et al. |
| 4,971,892 A | 11/1990 | Ali et al. |
| 4,997,745 A | 3/1991 | Kawamura et al. |
| 5,035,982 A | 7/1991 | Walls |
| 5,147,758 A | 9/1992 | Smothers et al. |
| 5,204,222 A | 4/1993 | Gersdorf et al. |
| 5,322,762 A | 6/1994 | Kushi et al. |
| 5,340,699 A | 8/1994 | Haley et al. |
| 5,368,990 A | 11/1994 | Kawabata et al. |
| 5,401,607 A | 3/1995 | Takiff et al. |
| 5,491,046 A | 2/1996 | DeBoer et al. |
| 5,496,903 A | 3/1996 | Watanabe et al. |
| 5,536,616 A | 7/1996 | Frechet et al. |
| 5,545,676 A | 8/1996 | Palazzotto et al. |
| 5,599,650 A | 2/1997 | Bi et al. |
| 5,629,354 A | 5/1997 | West et al. |
| 5,641,608 A | 6/1997 | Grunwald et al. |
| 5,650,261 A | 7/1997 | Winkle |
| 5,658,708 A | 8/1997 | Kondo |
| 5,756,258 A | 5/1998 | Yamaoka et al. |
| 5,756,261 A | 5/1998 | Takehana et al. |
| 5,763,134 A | 6/1998 | Busman et al. |
| 5,776,655 A | 7/1998 | West et al. |
| 5,800,965 A | 9/1998 | Tsuji et al. |
| 5,821,030 A | 10/1998 | West et al. |
| 5,888,700 A | 3/1999 | West et al. |
| 5,914,215 A | 6/1999 | West et al. |
| 5,919,601 A | 7/1999 | Nguyen et al. |
| 5,932,393 A | 8/1999 | Cunningham et al. |
| 5,942,372 A | 8/1999 | West et al. |
| 5,952,152 A | 9/1999 | Cunningham et al. |
| 5,965,319 A | 10/1999 | Kobayashi |
| 6,027,857 A | 2/2000 | Li et al. |
| 6,042,987 A | 3/2000 | Kobayashi |
| 6,054,260 A | 4/2000 | Adin et al. |

(Continued)

FOREIGN PATENT DOCUMENTS

EP          0 13 18 24 A2     1/1985

(Continued)

OTHER PUBLICATIONS

European Search Report, mailed Nov. 11, 2003, for European Application No. 02008135 (3 pages).

(Continued)

*Primary Examiner*—John S. Chu

(57) ABSTRACT

The present invention provides an imageable composition including an acid curable composition, an acid generator, an infrared absorber having a counter anion derived from a non-volatile acid, and a strong acid such as a sulfonic acid. The imageable composition may include components such as a crosslinkable binder or a colorant. In one embodiment, the imageable composition further includes a colorant having a counter anion derived from a non-volatile acid. The present invention further provides an imageable element, which includes a substrate and an imageable coating on a surface of the substrate. Also provided is method of producing an imaged element according to the invention.

67 Claims, 1 Drawing Sheet

U.S. PATENT DOCUMENTS

| | | | |
|---|---|---|---|
| 6,071,675 | A | 6/2000 | Teng |
| 6,153,356 | A | 11/2000 | Urano et al. |
| 6,242,101 | B1 | 6/2001 | Schwalm et al. |
| 6,242,156 | B1 | 6/2001 | Teng |
| 6,245,481 | B1 | 6/2001 | Teng |
| 6,245,486 | B1 | 6/2001 | Teng |
| 6,245,489 | B1 | 6/2001 | Baklanov et al. |
| 6,274,285 | B1 | 8/2001 | Gries et al. |
| 6,309,792 | B1 | 10/2001 | Hauck et al. |
| 6,326,123 | B1 | 12/2001 | West et al. |
| 6,352,811 | B1 | 3/2002 | Patel et al. |
| 6,383,714 | B1 * | 5/2002 | Nakamura et al. ....... 430/270.1 |
| 6,406,829 | B1 | 6/2002 | Tachikawa et al. |
| 6,416,928 | B1 | 7/2002 | Ohsawa et al. |
| 6,423,462 | B1 | 7/2002 | Kunita |
| 6,482,571 | B1 | 11/2002 | Teng |
| 6,558,875 | B1 | 5/2003 | Toshimitsu et al. |
| 6,562,543 | B1 | 5/2003 | Ogata et al. |
| 6,806,020 | B1 | 10/2004 | Haley et al. |
| 2002/0001771 | A1 | 1/2002 | Yates et al. |
| 2002/0025489 | A1 | 2/2002 | Shimada et al. |
| 2002/0197564 | A1 | 12/2002 | Timpe et al. |
| 2003/0003399 | A1 | 1/2003 | Muller et al. |
| 2003/0064318 | A1 | 4/2003 | Huang et al. |
| 2003/0082474 | A1 | 5/2003 | Haley et al. |
| 2003/0113655 | A1 | 6/2003 | Hayakawa et al. |
| 2003/0118939 | A1 | 6/2003 | Munnelly et al. |
| 2003/0194632 | A1 | 10/2003 | Ray et al. |
| 2004/0091811 | A1 | 5/2004 | Munnelly et al. |

FOREIGN PATENT DOCUMENTS

| | | |
|---|---|---|
| EP | 0 25 10 49 A2 | 1/1988 |
| EP | 0 43 81 23 A2 | 7/1991 |
| EP | 0 52 21 75 A1 | 1/1993 |
| EP | 0 61 19 97 A1 | 8/1994 |
| EP | 0 632 003 A1 | 1/1995 |
| EP | 0 67 25 44 A1 | 9/1995 |
| EP | 0 67 29 54 A2 | 9/1995 |
| EP | 0 73 02 01 A1 | 9/1996 |
| EP | 0 81 99 80 A1 | 1/1998 |
| EP | 0 81 99 85 A1 | 1/1998 |
| EP | 0 82 33 27 A2 | 2/1998 |
| EP | 0 88 93 63 A1 | 1/1999 |
| EP | 0 92 45 70 A1 | 6/1999 |
| EP | 0 94 18 66 A1 | 9/1999 |
| EP | 1 10 63 81 A1 | 6/2001 |
| EP | 1 11 70 05 A1 | 7/2001 |
| EP | 1 24 93 43 A2 | 10/2002 |
| EP | 02 74 2379.7 | 5/2004 |
| GB | 2083832 A | 3/1982 |
| GB | 2307474 A | 5/1997 |
| JP | 11-038633 | 5/1989 |
| JP | 03-291665 A2 | 12/1991 |
| JP | 9-034110 | 2/1997 |
| JP | 10-039509 A2 | 2/1998 |
| JP | 10-78249 A2 | 3/1998 |
| JP | 11-268438 A2 | 3/1998 |
| JP | 10-193554 A2 | 7/1998 |
| JP | 2001-159819 | 6/2001 |
| WO | WO 97/039894 | 10/1997 |
| WO | WO 99/046301 | 9/1999 |
| WO | WO 99/046310 | 9/1999 |
| WO | WO 00/048836 | 8/2000 |
| WO | WO 03/041962 A1 | 5/2003 |
| WO | WO 03/091022 A1 | 11/2003 |

OTHER PUBLICATIONS

Computer generated English translation of JP 2001-159819 from Japanese Patent Office website (25 pages).

Computer generated English translation of JP 09-034110 from Japanese Patent Office website (54 pages).

Computer generated English translation of Abstract for JP 11-038633 from Japanese Patent Office website (2 pages).

Wrzyszczynski et al., "Photoinduced Electron Transfer Polymerization. 4.4-Carboxybenzophenone-Sulfur-Containing Carboxylic Acids Photoredox Pairs as a Photoinitiating System for Free-Radical Polymerization", *Macromolecules* 2000, 33, 1577-1582.

* cited by examiner

IMAGEABLE COMPOSITION CONTAINING AN INFRARED ABSORBER WITH COUNTER ANION DERIVED FROM A NON-VOLATILE ACID

REFERENCE TO RELATED APPLICATIONS

This application is a continuation-in-part of U.S. patent application Ser. No. 09/933,864 filed Aug. 21, 2001, now U.S. Pat. No. 6,806,020, and entitled "Negative Working Imageable Composition Containing Sulfonic Acid," the disclosure of which is incorporated by reference in its entirety. This application is a continuation-in-part of U.S. patent application Ser. No. 09/933,884 filed Aug. 21, 2001, now U.S. Pat. No. 6,921,620 and entitled "Imageable Composition Containing Colorant Having a Counter Anion Derived from a Non-Volatile Acid," the disclosure of which is incorporated by reference in its entirety.

TECHNICAL FIELD

Lithographic printing plate precursors typically include a radiation imageable coating applied over a substrate material, such as an aluminum sheet. If after exposure to radiation, the exposed regions of the coating become soluble and are removed in the developing process, revealing the underlying hydrophilic surface of the support, the precursor is called "positive-working." Conversely, if exposed regions of the plate become insoluble in the developer and the unexposed regions are removed by the developing process, the plate is called "negative-working." In each instance, the regions of the radiation-sensitive layer that remain (i.e., the image areas) are ink-receptive and the regions of the hydrophilic surface revealed by the developing process accept water and repel ink.

Printing plates having a coating of a thermally imageable composition that includes an acid curable composition and either a "free acid" cure catalyst or a "latent acid" cure catalyst, such as an acid generator, are known. However, each of these systems suffers from disadvantages, which include difficulty of controlling the cure rates.

If a "free acid" cure catalyst is used in an amount sufficient to produce a satisfactory cure speed, the shelf life of the curable composition becomes severely limited because the curing process begins immediately upon contact of the free acid with the ingredients of the acid curable composition. If, on the other hand, lesser amounts of the cure catalyst are employed to improve the shelf life, the cure rate is reduced to unacceptably low levels.

In an alternative approach, if a "latent acid" cure catalyst is used in an amount sufficient to produce a satisfactory cure speed, the amount of energy required to generate the acid from the acid generator compound is unacceptably high even though the shelf life of the curable composition is satisfactory. If, on the other hand, lesser amounts of the "latent" cure catalyst were employed to improve the energy requirements of the acid generator, the cure rate would be reduced to unacceptably low levels.

The difficulty of controlling cure rates becomes even more acute if the one or more ingredients of the thermally imageable composition have counter anions that are derived from a volatile acid. Thus, if an ingredient of the thermally imageable composition has a counter anion, such as a halide ion derived from a volatile acid, the halide ion is converted to the volatile acid by combining with a proton under the strongly acidic cure conditions. The volatile acid, for example, HF, HCl, HBr or HI, would then be easily volatilized and lost under the conditions of thermal imaging and subsequent baking, thereby reducing the cure rate. If a "latent acid" cure catalyst having a counter anion derived from a volatile acid is used, the cure rate would also be reduced to unacceptably low levels because of the loss of the volatile acid under the conditions of thermal imaging and subsequent baking.

U.S. Pat. No. 5,965,319 and Japanese Patent Application JP 10-039,509 describe a negatively working composition having an infrared absorber, novolak and resole resins, and an iodonium, sulfonium or diazonium salt, with a sulfonate group as counter ion. There is no teaching that the presence of sulfonic acid as a discrete additive or the presence of a dye having a counter anion derived from a non-volatile acid, such as "D11 dye" (described below), will improve cure rate and processing latitude.

U.S. Pat. No. 6,042,987 describes a thermal negative system in which an acid is produced from a typical generator upon exposure to infrared radiation. This promotes crosslinking between a novolak and a crosslinking species.

Japanese Patent Application JP 11-268,438 describes a thermal positive plate having a novolak resin and an infrared absorber that has a thermally decomposable sulfonate directly attached thereto. At unimaged regions of the plate, the absorber acts as an insolubilizer and, at imaged areas, it acts as a dissolution accelerant. Japanese Patent Application JP 10-193,554 describes a negative plate having excellent run length by virtue of a new, improved polymer. Japanese Patent Application JP 3-291,665 discloses conventionally imaged negative plate systems.

U.S. Pat. Nos. 5,340,699 and 5,919,601 describe imageable compositions having a binder, a crosslinker, an acid generator and an infrared absorber. These patents do not describe the use of a strong acid in addition to the acid generator or that added sulfonic acids would improve plate speed or processing latitude.

U.S. Pat. No. 5,641,608 describes ablative and positive/negative solubility differential systems for PCB precursors. The negative systems rely on adding an amine active ingredient just prior to use, or by employing a "ultraviolet flood then infrared exposure" process. U.S. Pat. No. 5,763,134 describes a composition having an acid generator, typically a triazine, and a squarylium dye having a defined nucleus. European Patent Application EP 0 632 003 describes MeO- and Me-containing phenol compounds for use as improved heat curing additives in conventional positive plates.

SUMMARY OF THE INVENTION

The present invention relates to an imageable composition, and an imageable element made using the imageable composition. The imageable element may be especially useful as a printing plate precursor.

Practice of the present invention permits improvements in imaging speed and processing latitude and robustness of thermal, pre-heat, negatively working imageable compositions, especially as used in printing plate precursors, while maintaining adequate shelf life. Practice of the present invention further provides an improved formulating scope. Previous attempts to improve speed and fog control have had deleterious effects on plate performance. Thus, if one is able to prepare a fast plate, a plate having a poor shelf life is obtained. Conversely, if a plate having a good shelf life is prepared, a slow plate is obtained. In contrast, the present invention may provide a substantial improvement in the speed and processing robustness of thermal, pre-heated, negatively working patterning compositions, such as printing plates, forms, screens, resists, and the like, while maintaining adequate shelf life, improvements in plate speed and increased processing latitude of thermal, pre-heat negative plates.

More particularly, the present invention relates to an imageable composition having an acid curable composition, and an acid generator. The imageable composition may include components such as a crosslinkable binder, a crosslinking agent, an infrared absorber, or a colorant.

In one embodiment, the imageable composition includes an infrared absorber having a counter anion derived from a non-volatile acid. In another embodiment, the imageable composition includes a colorant, such as a colorant dye or a colorant pigment, having a counter anion derived from a non-volatile acid. As described herein, inclusion of a dye, such as D11 dye, which has a counter anion that can combine with a proton to produce a non-volatile acid, may significantly improve cure rate and processing latitude of an imageable composition.

In another embodiment, a strong acid such as a sulfonic acid is included in the imageable composition. As described herein, incorporating a small amount of a sulfonic acid into an imageable element may increase the imaging speed of the imageable element and may allow maximum image density at wider preheat temperatures. It may also provide significantly improved processing latitude while maintaining an adequate shelf life.

In still another embodiment, the imageable composition includes both an infrared absorber having a counter anion derived from a non-volatile acid, and a colorant having a counter anion derived from a non-volatile acid.

In another embodiment, the present invention provides an imageable element, which includes a substrate and an imageable composition coated on a surface of the substrate.

None of the references discussed above report that the presence of a strong acid, such as a sulfonic acid, and/or the presence of a colorant having a counter anion that can combine with a proton to produce a non-volatile acid (such as, for example, D11 dye), will improve cure rate and processing latitude when included in an imageable composition.

The present invention further provides methods for making an imageable element, and methods for producing an imaged element.

DETAILED DESCRIPTION OF THE INVENTION

Figure 1:
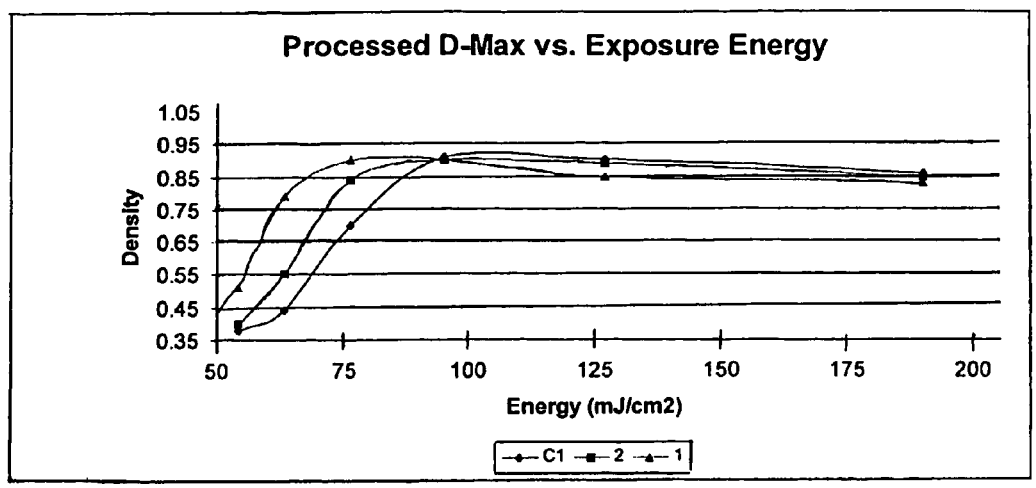
FIG. 1 depicts a plot of Solid Density ($D_{max}$) of thermally exposed, preheated and developed plates versus Exposure Energy ($mJ/cm^2$).

The present invention provides an imageable composition having an acid curable composition, and an acid generator. The imageable composition typically includes a photothermal converter, such as an infrared absorber. The infrared absorber may have a counter anion derived from a non-volatile acid. In some embodiments, a strong acid such as a sulfonic acid is included in the imageable composition.

The imageable composition may include components such as a crosslinkable binder, a crosslinking agent, or a colorant. In one embodiment, the imageable composition includes a colorant, such as a colorant dye or a colorant pigment, having a counter anion derived from a non-volatile acid. In still another embodiment, the imageable composition includes both a colorant having a counter anion derived from a non-volatile acid, and an infrared absorber having a counter anion derived from a non-volatile acid.

The present invention also provides an imageable element, which includes a substrate and an imageable coating on a surface of the substrate. Also provided by the invention are a method for making an imageable element, and a method for producing an imaged element.

As used herein, the term "hydrocarbyl" refers to a linear, branched or cyclic alkyl, alkenyl, aryl, aralkyl or alkaryl of 1 to 22 carbon atoms, substituted derivatives thereof, wherein the substituent group is selected from halogen, hydroxy, hydrocarbyloxy, carboxyl, ester, ketone, cyano, amino, amido and nitro groups. Hydrocarbyl groups in which the carbon chain is interrupted by oxygen, nitrogen or sulfur are also included in the term "hydrocarbyl".

Imageable Composition

The imageable composition of the present invention includes at least an acid curable composition and an acid generator. The imageable composition generally includes a photothermal converter, such as an infrared absorber. The imageable composition may include components such as a crosslinkable binder, a crosslinking agent, or a colorant. In one embodiment, the imageable composition includes a colorant, such as a colorant dye or a colorant pigment, having a counter anion derived from a non-volatile acid. In another embodiment, a strong acid such as a sulfonic acid is included in the imageable composition.

Acid Curable Composition

The acid curable composition may include a binder and a crosslinking agent for that binder. Suitable binders include polymers that have at least two, preferably more than two reactive groups, such as hydroxy, carboxylic acid, amine, carbamate, amide, sulfonamide or imide. Preferably, the reactive group is a hydroxy group, such that, the polymer can be a polyol, a polyether polyol, a novolak resin, a hydroxyfunctional acrylic resin, a hydroxyfunctional polyester resin and combination thereof.

The crosslinking agent can be any suitable crosslinking agent known in the art and includes crosslinking agents such as a resole resin, an amino resin, an amido resin, an epoxy compound having at least two epoxide groups and the like. A combination of the aforementioned crosslinkers can also be used.

The crosslinking agent preferably is an amino resin that has at least two alkoxymethyl groups, including amino resins, such as, an alkoxymethylated melamine resin, an alkoxymethylated benzoguanamine resin, an alkoxymethylated glycoluril, an alkoxymethylated polyacrylamid, an alkoxymethylated polymethacrylamid and a combination thereof. Preferably, the alkyl group in the alkoxymethylated amino resins is derived from an alcohol of 1 to 4 carbon atoms, such as methanol, ethanol, propanol, butyl alcohol, isomers thereof and mixtures thereof. Examples of such amino resins include alkoxymethylated melamine resins having from about 2 to about 6 methoxymethyl groups.

The acid curable composition can include a self-crosslinking material such as a resole resin. However, in addition to the resole resin, the acid curable composition can further include a polymer having at least two reactive groups such as hydroxy, carboxylic acid, amine, carbamate, amide, sulfonamide or imide, to form a crosslinked network with the resole resin. Preferably, the acid curable composition includes a resole resin and a novolak resin.

The acid curable composition can further include an isocyanate crosslinking agent that has at least two, preferably more than two isocyanate groups. Such isocyanate crosslinkers include diisocyanates, such as isophorone diisocyanate, methylene-bis-phenyl diisocyanate, toluene diisocyanate, hexamethylene diisocyanate, tetramethylxylylene diisocyanate, dimers thereof, adducts thereof with diols or triols, and mixtures thereof.

Acid Generator

The imageable composition of the present invention also includes an acid generator, which is an ultraviolet, visible or infrared radiation-sensitive or heat-activated compound. Upon exposure to ultraviolet, visible radiation, infrared radiation or heat, either directly, or indirectly through heat transfer from an infrared absorbing compound, the acid generator produces a free acid, which acts as a cure catalyst for the curing process.

Suitable acid generators include onium salts, covalently bound sulfonate group containing compounds, hydrocarbylsulfonamido-N-hydrocarbyl sulfonate and a combination thereof. Examples of the covalently bound sulfonate group containing compounds include hydrocarbyl sulfonates, such as methyl tosylate, ethyl tosylate, benzoin tosylate, and the like.

When an ultraviolet radiation is used with a thermally activated acid generator, the composition can further include a photothermal converter material for converting ultraviolet energy to thermal energy. In addition, a ultraviolet/visible sensitizer selected from monomolecular or polymeric compounds containing an anthracene moiety, thioxanthone moiety or alkylaminobenzophenone moiety can also be used. However, in the case of ultraviolet-activated acid generators, the use of a photothermal converter material is not necessary.

Preferably, the acid generator is an onium salt that has a non-nucleophilic counter anion derived from a non-volatile acid, such as sulfate, bisulfate, tetrafluoroborate, hexafluorophosphate, hexafluoroarsenate, hexafluoroantimonate, tetrakis(pentafluoro-phenyl)borate, triflate, pentafluoropropionate, pentafluoroethanesulfonate, benzenesulfonate, p-methylbenzenesulfonate and pentafluorobenzene-sulfonate.

Examples of such onium salts include iodonium salts, sulfonium salts, hydrocarbyloxysulfonium salts, hydrocarbyloxyammonium salts, aryl diazonium salts and combinations thereof. Examples of the hydrocarbyloxy ammonium salts include the salts of N-hydrocarbyloxy substituted nitrogen containing heterocyclic compounds, such as N-ethoxy-isoquinolinium hexafluorophosphate. Examples of the iodonium salts include 4-octyloxyphenyl phenyliodonium hexafluoroantimonate.

Preferably, the acid generator is a monomeric or oligomeric aromatic diazonium salt. The monomeric and oligomeric diazonium salts can be any diazonium salt known in the art that is suitable for use in thermal imaging, In some embodiments, the diazonium salt has a counter anion that is other than halide. Examples of such counter anions include sulfate, bisulfate, tetrafluoroborate, hexafluorophosphate, hexafluoroarsenate, hexafluoroantimonate, tetrakis(pentafluoro-phenyl)borate, triflate, pentafluoropropionate, pentafluoroethanesulfonate, benzenesulfonate, p-methylbenzene sulfonate and pentafluorobenzenesulfonate. Preferably, such diazonium salts are aromatic and more preferably, are derivatives of diphenylamine-4-diazonium salts, including, for example, for example, 4-diazodiphenylamine sulfate. Examples of such aromatic diazonium salts include: diphenyl-4-diazonium sulfate; 2-4-naphthyl-2-methyl)-N-propylamino)-benzenediazonium sulfate; chloro-diphenyl-4-diazonium sulfate; 4-(3-phenyl-propylamino)-benzenediazonium sulfate; 4-(N-ethyl-N-(benzyl)-amino)-benzenediazonium sulfate; 4-(N,N-dmethyl-amino)-benzenediazonium tetrafluoroborate; 4-(N-(3-phenyl-mercapto-propyl)-N-ethyl-amino)-2-chlorobenzenediazonium sulfate; 4-(4-methylphenoxy)-benzenediazonium sulfate; 4-(phenylmercapto)-benzenediazonium sulfate; 4-phenoxybenzenediazonium sulfate; 4-(benzoylamino)-benzenediazonium hexafluorophosphate; methylcarbazole-3-diazonium sulfate; 3-methyl-diphenyleneoxide-2-diazonium sulfate, 3-methyldiphenylamine-4-diazonium sulfate; 2,3',5-trimethoxydiphenyl-4-diazonium sulfate; 2,4',5-triethoxydiphenyl-4-diazonium sulfate; 4-(3-(3-methoxyphenyl)-propylamino)benzenediazonium sulfate; 4-(N-ethyl-N-(4-methoxybenzyl)-amino) benzenediazonium sulfate; 4-(N-(naphthyl-(2)-methyl)-N-n-propylamino)methoxybenzenediazonium sulfate; 4-(N-(3-phenoxypropyl)-N-methylamino)-2,5-dimethoxybenzene-diazonium tetrafluoroborate; 4-(N-(3-phenylmercaptopropyl)-N-ethylamino)-2-chloro-5-methoxybenzenediazonium sulfate; 4-(4-(3-methylphenoxy)-phenoxy)-2,5-dimethoxybenzenediazonium sulfate; 4-(4-methoxy-phenylmercapto)-2,5-diethoxybenzenediazonium sulfate; 2,5-diethoxy- 4-phenoxybenzenediazonium sulfate; 4-(3,5-dimethoxybenzoylamino)-2,5-diethoxybenzenediazonium hexafluorophosphate; methoxycarbazole-3-diazonium sulfate; 3-methoxy-diphenyleneoxide-2-diazonium sulfate; and methoxydiphenylamine-4-diazonium sulfate.

Diazonium salts derived from the following amines are also suitable for use in the present invention: 4-amino-3-methoxydiphenylamine, 4-amino-2-methoxydiphenylamine, 4'-amino-2-methoxydiphenylamine, 4'-amino-4-methoxydiphenylamine, 4-amino-3-ethoxydiphenylamine, 4-amino-3-hexyloxydiphenylamine, 4-amino-3-beta-hydroxyethoxydiphenylamine, 4'-amino-2-methoxy-5-methyl-diphenylamine, 4-amino-3-methoxy-6-methyl-diphenylamine, 4'-amino-4-n-butoxydiphenylamine, 4'-amino-3',4-dimethoxydiphenylamine, 4-amino-diphenylamine, 4-amino-3-methyl-diphenylamine, 4-amino-3-ethyldiphenylamine, 4'-amino-3-methyl-diphenylamine, 4'-amino-4-methyl-diphenylamine, 4'-amino-3,3'-dimethyldiphenylamine, 3'-chloro-4-amino-diphenylamine, 4-aminodiphenyl-amine-2-sulfonic acid, 4-aminodiphenylamine-2-carboxylic acid, 4-aminodiphenylamine-2'-carboxylic acid and 4'-bromo-4-aminodiphenylamine. Preferred are 4-amino-diphenylamine, 3-methyl-4-aminodiphenylamine, 3-alkoxy-4-aminodiphenylamines having 1 to 3 carbon atoms in the alkoxy group and 3-methoxy-4-aminodiphenylamine.

Preferably, the counter anion of the aromatic diazonium salt can be mesitylene sulfonate, toluene sulfonate, methane sulfonate, naphthalene sulfonate, trifluoromethane sulfonate, hexafluorophosphate and tetrafluoroborate.

Examples of particularly suitable monomeric aromatic diazonium salts include 2-methoxy-4phenylaminobenzenediazonium hexafluorophosphate (diazo MSPF6) represented by the formula:

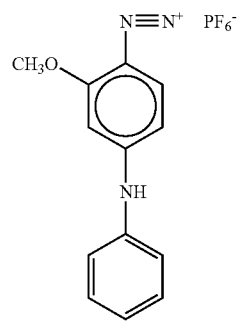

2-methoxy-4-phenylaminobenzenediazonium p-toluenesulfonate represented by the formula:

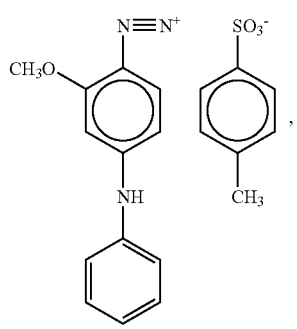

and a combination thereof.

Examples of particularly suitable oligomeric aromatic diazonium salts include compounds represented by the formula:

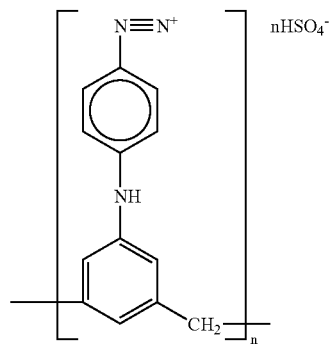

which is manufactured by St. Jean Photochemicals, Quebec, Canada, under the trade name DTS-18;

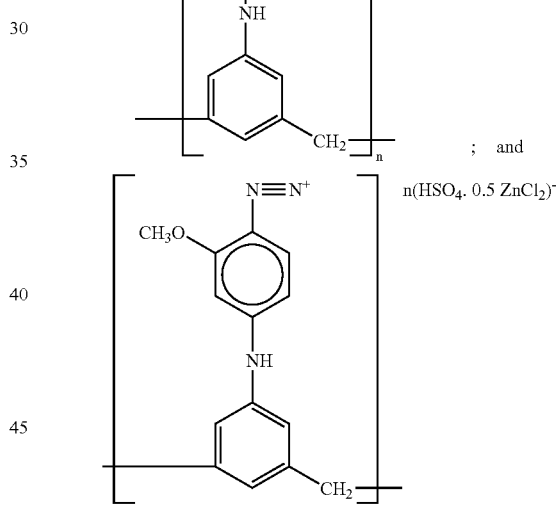

wherein n is from 1 to 11; and a combination thereof. Mixtures of any of the aforementioned diazonium salts are also suitable.

Colorant

The imageable compositions of the present invention may optionally include a colorant. In the context of the present invention, the term "colorant" includes colorant dyes and colorant pigments.

In one embodiment of the invention, the imageable composition includes a colorant having a counter anion derived from a non-volatile acid. The term "volatile acid" in the context of the present invention refers to hydrogen halides such as HF, HCl, HBr and HI, which can escape from the imageable composition during imaging and/or baking steps.

The term "non-volatile acid" in the context of the present invention refers to any non-halogen acid.

As described herein, using a colorant having a counter anion derived from a non-volatile acid (such as D11 dye) in the place of a conventional colorant (such as Victoria Blue FBO) in a pre-heat, thermal printing plate precursor increases the speed of the thermal plate and allows maximum image density at wider preheat temperatures (i.e., improved processing latitude). Such improvements may result from the presence of one or more components in the imageable composition which contain anions derived from a non-volatile acid, so that when such anions are combined with a proton, a non-volatile acid is produced, which cannot escape from the imageable coating during processing.

The anions capable of producing a non-volatile acid might be donated from an infrared dye, such as the following:

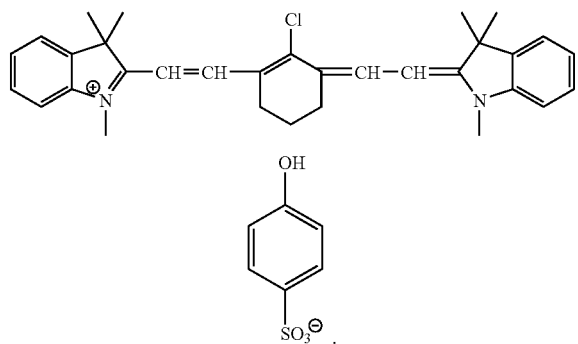

Alternatively, the anions capable of producing non-volatile acid might be provided from, for example, a blue colorant dye, such as D11 dye having the structure shown below:

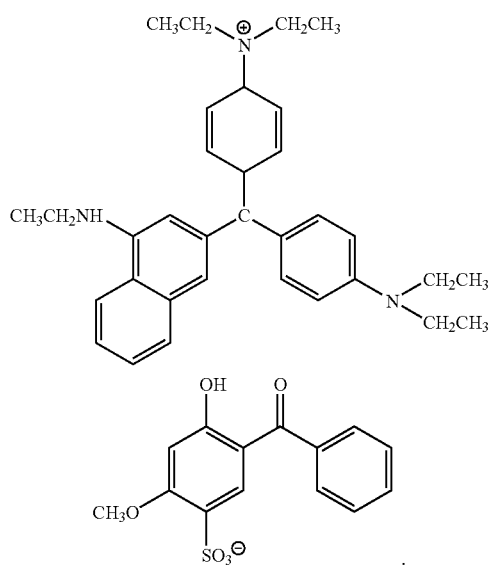

The above-described colorant may be used in combination with, or in place of, a conventional colorant, such as a pigment or dye that does not meet the foregoing description.

Strong Acid

In addition to the acid generator, the imageable composition of the present invention can optionally include a strong acid, typically introduced into the composition as the free acid.

The term "strong acid" is defined herein as an acid that has a pKa of not more than about 8. Preferably, the strong acid of the present invention has a pKa of not more than about 5. More preferably, the strong acid of the present invention has a pKa of not more than about 4. Mixtures of strong acids can also be used to obtain desired cure rates and properties.

Examples of suitable strong acids include sulfonic acids represented by the formula:

R—SO$_3$H wherein R is a substituted or unsubstituted hydrocarbyl of 1 to 22 carbon atoms, or a substituted or unsubstituted aryl of 6 to 22 carbon atoms.

The alkyl sulfonic acids can be represented by the above formula, wherein the R group is preferably a linear, branched or cyclic alkyl of 1 to 22 carbon atom or a linear, branched or cyclic haloalkyl of 1 to 22 carbon atom having at least one halogen. Mixtures of these acids can also be used. Preferably, a haloalkyl group has two or more halogen atoms. Preferred halogens include chlorine and fluorine.

The aryl sulfonic acids can be represented by the formula:

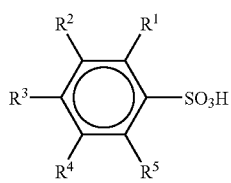

wherein each of R$^1$, R$^2$, R$^3$, R$^4$ and R$^5$ can independently be hydrogen, an alkyl of 1 to 12 carbon atoms, a haloalkyl of 1 to 22 carbon atoms having at least one halogen, an aryl of 6 to 12 carbon atoms, a halogen, a hydroxy, an alkoxy, a cyano, a nitro, an alkoxycarbonyl or an acyl group represented by the formula:

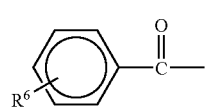

wherein R$^6$ can be hydrogen, alkyl of 1 to 12 carbon atoms, haloalkyl of 1 to 12 carbon atoms having at least one halogen atom, alkoxy, cyano, nitro, alkoxycarbonyl and acetyl.

A preferred class of aryl sulfonic acids can be represented by the formula:

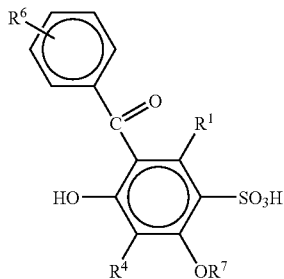

wherein each of $R^1$, $R^4$ and $R^6$ can be hydrogen, alkyl of 1 to 12 carbon atoms, haloalkyl of 1 to 12 carbon atoms having at least one halogen, aryl of 6 to 12 carbon atoms, halogen, hydroxy, alkoxy, cyano, nitro, alkoxycarbonyl or acyl, and wherein $R^7$ can be hydrogen, alkyl of 1 to 12 carbon atoms, haloalkyl of 1 to 12 carbon atoms having at least one halogen, aryl of 6 to 12 carbon atoms, alkoxycarbonyl and acyl. An example of such an aryl sulfonic acid is 3-benzoyl-4-hydroxy-6-methoxybenzenesulfonic acid.

As described herein, incorporating a small amount of a sulfonic acid into a pre-heat, thermal plate increases the speed of the thermal plate and allows maximum image density at wider preheat temperatures. In addition, it provides significantly improved processing latitude while maintaining an adequate shelf life.

For example, when an experiment was completed adding 0 to 1% 3-benzoyl-4-hydroxy-6-methoxybenzenesulfonic acid (HMBS) into a series of coatings for thermal pre-heat plates, dramatic increases in speed were found at 0.04% level. In addition the formulation had a 30 to 40° F. preheat window. With pre-heat plates including the 3-benzoyl-4-hydroxy-6-methoxybenzene sulfonic acid (HMBS), plate speed was around 80 mJ/cm² with a 250° F. preheat temperature, when the plate system was developed in MX1710.

Infrared Absorber

The imageable composition of the present invention can optionally include an infrared absorber, such as an infrared-absorbing pigment or dye or a combination thereof.

Depending on the manner of exposure of the imageable element to radiation, the imageable composition can optionally include an infrared absorber in addition to the acid curable composition and the acid generator. Thus, when imagewise exposure of a thermally imageable composition is carried out directly through physical contact by a hot stylus, the use of an infrared absorber is not necessary. On the other hand, if imagewise exposure of the imageable composition is carried out by exposing the imageable composition to infrared radiation, such as from an infrared laser, the use of an infrared absorber is necessary.

Examples of suitable pigments include black pigments, yellow pigments, orange pigments, brown pigments, red pigments, purple pigments, blue pigments, green pigments, fluorescent pigments, metal powder pigments, polymer bond pigments, insoluble azo pigments, azo lake pigments, condensation azo pigments, chelate azo pigment, phthalocyanine pigments, anthraquinone pigments, perylene pigments, perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, carbon black, Paris Blue, Prussian Blue or any combination thereof.

Examples of suitable dyes include cyanine dyes, squarylium dyes, pyrylium salts and nickel thiolate complexes.

A particularly useful class of infrared absorbing dyes include compounds represented by the formula:

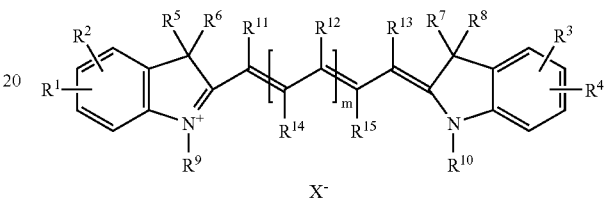

wherein each $R^1$, $R^2$, $R^3$ and $R^4$ is independently selected from the group consisting of: a linear, branched or cyclic alkyl of 1 to 12 carbon atoms, alkenyl of 1 to 12 carbon atoms, alkoxy of 1 to 12 carbon atoms in the alkyl and aryl of 1 to 12 carbon atoms;

wherein each pair selected from the group consisting of: $R^1$ and $R^2$ and $R^3$ and $R^4$ may be bonded together to form a fused aromatic ring;

wherein each $R^5$, $R^6$, $R^7$, $R^8$, $R^9$ and $R^{10}$ is independently selected from the group consisting of: a linear, branched or cyclic alkyl of 1 to 12 carbon atoms, wherein each of said alkyls can independently have a substituent;

wherein each $R^{11}$, $R^{12}$ and $R^{13}$ is independently selected from the group consisting of: hydrogen, halogen, a linear, branched or cyclic alkyl of 1 to 8 carbon atoms, wherein each of said alkyls can independently have a substituent; wherein $R^{12}$ may be bonded to $R^{11}$ or $R^{13}$ to form a ring structure; and when m is greater than 2, a plurality of $R^{12}$ may bonded to each other to form a ring structure;

wherein each $R^{14}$ and $R^{15}$ is independently selected from the group consisting of: hydrogen, halogen, a linear, branched or cyclic alkyl of 1 to 8 carbon atoms, wherein each of said alkyls can independently have a substituent; wherein $R^{14}$ may be bonded to $R^{15}$ to form a ring structure; and when m is greater than 2, a plurality of $R^{14}$ may bonded to each other to form a ring structure; and wherein m is an integer from 1 to 8; and $X^-$ is a counter anion derived from either a volatile or a non-volatile acid.

In some embodiments, the counter anion in the above infrared absorbing dyes is derived from a non-volatile acid. In other embodiments, the infrared absorbing dye can have a counter anion derived from a volatile acid, such as when a colorant having a counter anion derived from a non-volatile acid is present. In yet another embodiment, both the colorant and the infrared absorbing dye include anions that are derived from non-volatile acids.

Specific examples of dyes having a counter anion derived from a non-volatile acid include the following compounds:

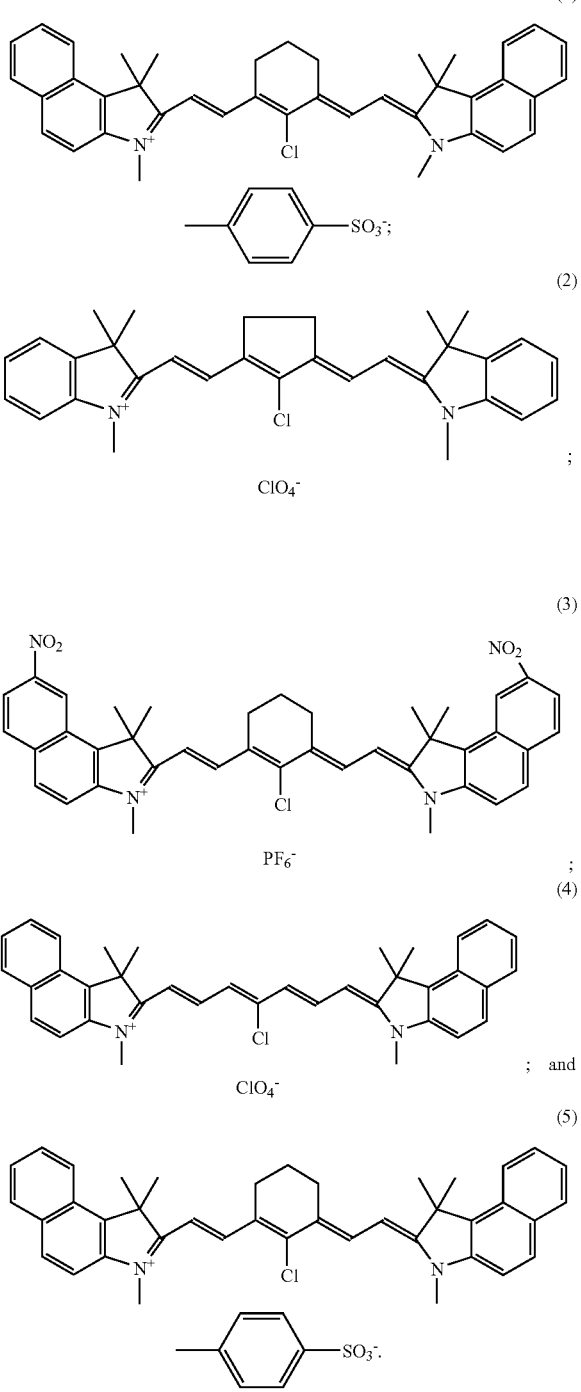

These dyes (1)–(5) have the property of generating heat upon absorbing infrared radiation. Furthermore, they have an infrared absorb band in the range from 700 to 1200 nm and thus are suitable for use in the imageable compositions of the present invention.

Further examples of dyes and pigments include triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments and those that are mentioned in U.S. Pat. Nos. 5,919,601, 3,218,167, and 3,884,693, the contents of which are incorporated herein by reference in their entirety.

Imageable Element

The present invention also provides an imageable element, which employs the imageable composition of the present invention. The imageable element includes a substrate and an imageable coating on a surface of the substrate and including an imageable composition according to the present invention.

The imageable element of the present invention may be a single layer or multilayer imageable element useful in lithographic printing, for example, as a lithographic printing plates that can be thermally imaged by imagewise exposure with a laser or a thermal printing head. In a multilayer imageable element, the element may have an underlying layer which can be removed by treatment with an aqueous alkaline solution, and an imageable coating including the imageable composition of the present invention, which upon imaging exhibits a decreased solubility of the exposed regions in a suitable developer solution, i.e., is negative working.

Substrate

The substrate of the imageable element is typically an aluminum sheet. However, other materials that are commonly known to those skilled in the art can also be used.

Suitable substrates include any sheet material conventionally used to prepare lithographic printing plates, including metals such as aluminum sheets; paper; paper coated on one or both sides with an alpha-olefin polymer such as polyethylene; acetate films such as polyvinyl acetate and cellulose acetate film; polyvinyl acetal film; polystyrene film; polypropylene film; polyester film such as polyethylene terephthalate film; polyamide film; polyimide film; nitrocellulose film; polycarbonate film; polyvinyl chloride film; composite films such as polyester, polypropylene or polystyrene film coated with polyethylene film; metallized paper or films; metal/paper laminates; Perlon gauze; plates of magnesium, zinc, copper, anodized aluminum, electrochemically roughened aluminum, steel, and the like.

An especially suitable substrate for the imageable element of present invention is an aluminum sheet. The surface of the aluminum sheet may be treated with metal finishing techniques known in the art including physical roughening, electrochemical roughening, chemical roughening, anodizing, and silicate sealing and the like. Graining (or roughening) can be accomplished by mechanical or electrochemical processes or by a combination of both processes.

An example of a treated aluminum substrate is electrochemically-grained and anodized aluminum, such as commonly used for lithographic printing plates. Anodized substrates can be prepared using sulfuric acid anodization, phosphoric acid anodization or a combination thereof. Other conventional anodization methods can also be used in the preparation of the anodized substrate of the present invention. The surfaces of these materials can be subjected to a pretreatment, if necessary, using the surface treatment techniques known in the art to improve adhesion between the substrate and organic coatings.

Suitable post-treatments include silication and polyvinyl phosphonic acid. Post-treatment with phosphate or phosphate/fluoride, followed by silication, can also be used.

Imageable Coating

The imageable coating includes an imageable composition of the present invention. The imaging layer of the imageable element is negative working; i.e., exposed regions exhibit a decreased solubility in a suitable developer solution. In some embodiments, the imageable coating is thermally imageable, so that the imageable element according to the present invention is imageable by infrared radiation.

In addition to an imageable composition described above, the imageable coating may include a minor amount of other conventional additives. For example, known plasticizers, adhesion promoters, flow control agents and/or UV absorbers can be included in the imageable coating. The type and quantity of such additives depend on the purpose for which the imageable element according to the present invention is intended for use. In any case, however, care must be taken that the substances added do not absorb an excessive proportion of the radiation required for acid generation and thus reduce the crosslinking sensitivity of the composition.

Suitable plasticizers include dibutyl phthalate, diisooctyladipate, nitro esters, alkyl and aryl phosphate esters, chlorinated paraffins. Glycols or aliphatic polyols can also be added. If it is desired to ensure good storability under relative high atmospheric moisture conditions, the use of water-insoluble plasticizers is preferred.

Adhesion promoters can also be added. Suitable adhesion promoters include monomeric or polymeric organic silanes, nitrogen-containing heterocyclic compounds, such as those disclosed in U.S. Pat. Nos. 3,645,722, 3,622,234, and 3,827,908, heterocyclic mercaptan compounds, mercapto alkanoic acid anilides and mercapto alkanoic acid esters.

The imageable coating can be applied using conventional application methods known in the art. For example, the imageable composition can be dissolved in solvents, preferably organic solvents, and applied to an aluminum substrate.

After proper drying, the coating weight of the imaging layer preferably is in the range of about 0.2 to about 5.0 g/m$^2$, and more preferably in the range from about 0.7 to about 2.5 g/m$^2$.

Additional Layers

In addition to the imageable coating, the imageable element can optionally have additional layers, such as an underlying layer. Possible functions of an underlying layer include:

(1) to enhance developability of the imagewise unexposed areas; and (2) to act as a thermal insulating layer for the imagewise exposed areas.

For thermal imaging, a thermal insulating layer prevents otherwise rapid heat dissipation, for example, through the heat conducting aluminum substrate. This allows more efficient thermal imaging throughout the imageable coating, particularly in the lower sections. In accordance with these functions, the underlying layer should be soluble or at least dispersible in the developer and, preferably, have a relatively low thermal conductivity coefficient.

The imageable element can optionally include a layer overlying the imageable coating. Possible functions of an overlying layer include:

(1) to prevent damage, such as scratching, of the imageable coating during handling prior to imagewise exposure; and (2) to prevent damage to the surface of the imagewise exposed areas, for example, by over-exposure, which could result in partial ablation.

The overlying layer should be soluble, dispersible or at least permeable to the developer.

Method for Producing an Imaged Element

The present invention further provides methods for producing an imaged element. An imaged element can be produced using the imageable element described above, for example.

In one step of the method, the imageable element is imagewise exposed to radiation to produce an exposed element having exposed and unexposed regions of the coating. Upon imaging, the developer solubility of the exposed regions is decreased to allow differentiation between exposed and unexposed regions for development.

In one embodiment of the method, the step of imagewise exposing the imageable element to radiation is carried out using infrared radiation. The step of imagewise exposing may employ analog or digital means. The exposing step of this method is suitably carried out using an infrared laser, for example. In another embodiment of the method, the exposing step is carried out using a heated body, such as a hot stylus. The methods can also be practiced by imagewise exposing the imageable element to ultraviolet radiation, provided that the imageable composition includes a suitable photothermal converting material.

Following imagewise exposure, an exposed element having exposed regions and complimentary unexposed regions is obtained. In another step of the method, the exposed element is generally baked at a temperature and period of time sufficient to produce a cured element. The exposed element is generally baked at a temperature from about 220° F. to about 280° F., typically from about 240° F. to about 260° F. for a period of time from about 45 seconds to about 75 seconds, typically from about 55 seconds to about 65 seconds, to effect curing.

The cured element is contacted with a developer in another step of the method, to remove the unexposed regions of the coating and produce the imaged element. The developer is capable of selectively removing uncrosslinked materials in the unexposed regions. The unexposed regions of the layer are removed by treatment with a suitable developer, such as an aqueous acid or base solution. The developer composition is dependent on the nature of the polymeric substance, but is preferably an aqueous composition. Common components of aqueous developers include surfactants, chelating agents, such as salts of ethylenediamine tetraacetic acid, organic solvents, such as benzyl alcohol, ethylene glycol monomethyl ether, ethylene glycol monoethyl ether, diacetone alcohol, butyl acetate, ethylene glycol methyl ether acetate, methyl isobutyl ketone and a mixture thereof, and alkaline components, such as organic amines, including alkanol amines, such as triethanol amine and methyl diethanol amine, inorganic metasilicates, organic metasilicates, hydroxides and bicarbonates.

The pH of an aqueous developer is generally about 5 to about 14, depending on the nature of the composition of the imaging layer. Development can be performed by any known manner, for instance, by rubbing the plate surface with a developing pad containing the foregoing developer or by pouring the developer on the plate surface and then rubbing the surface with a developing brush in water.

The invention is further described in the following examples, which are intended to be illustrative and not limiting.

EXAMPLES

The following are referred to hereinafter:

(1) Resin A—a resole resin, UCAR phenolic resin BKS-5928 as supplied by Union Carbide Corporation.

(2) Resin B—a novolak resin, N-9P as supplied by Eastman Kodak Company (Rochester, N.Y.).

(3) Resin C—a novolak resin, N-13 as supplied by Eastman Kodak Company.

(4) Acid generator A—Diazo MSPF6 as supplied by Diversitec Corporation (Fort Collins, Colo.) having the following structure:

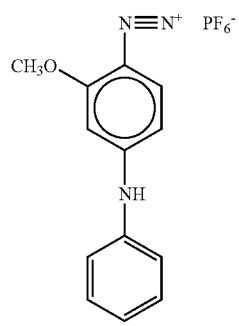

(5) IR dye A—infrared-absorbing dye having the following structure:

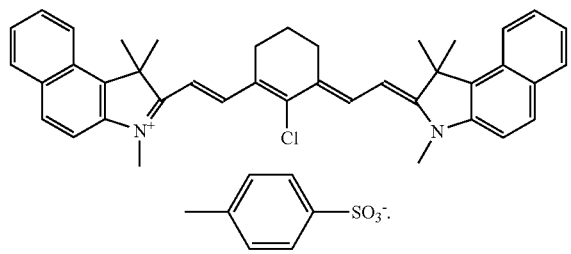

(6) Blue dye A—Simbase Victoria Blue FBO 23363, as supplied by Charkit Chemical Corporation (Darien, Conn.).

(7) Blue Dye B—D11 dye having the structure:

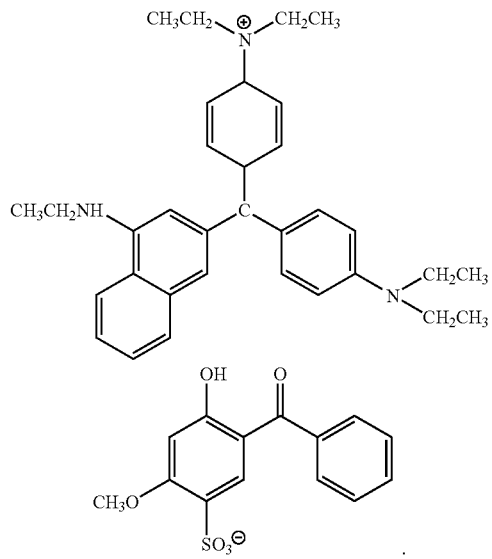

(8) Terephthaldehyde as supplied by Aldrich Chemical Co. (Milwaukee, Wis.).

(9) XDSA, having the following structure:

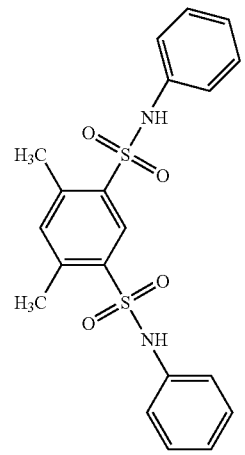

(10) HMBS—3-benzoyl-4-hydroxy-6-methoxybenzene-sulfonic acid as supplied by Aldrich Chemical Co.

(11) Substrate—0.3 mm thick sheets of aluminum that had been electrograined, anodised and post-anodically treated with an aqueous solution of an inorganic phosphate.

(12) Developer A—MX1710 as supplied by Kodak Polychrome Graphics.

(13) Developer B—9005+ as supplied by Kodak Polychrome Graphics.

(13) Creo TRENDSETTER 3244: a commercially available platesetter, operating at a wavelength of 830 nm, as supplied by Creo Products (Burnaby, British Columbia).

(14) Gretag MACBETH D19C densitometer: a commercially available densitometer as supplied by Color Data Systems Limited (Wirral, United Kingdom).

(15) X-Rite 408 densitometer: a commercially available densitometer supplied by X-Rite, Inc. (Grandville, Mich.).

Comparative Example C1 and Examples A1 to A4

Coating formulations comprised solutions of the components described in Table 1 in 1-methoxypropan-2-ol/acetone 97:3 (w:w). Plates were prepared by coating the formulations onto the aluminum substrate by means of a wire wound bar. The formulation concentrations were selected to provide dry films having a coating weight of 120 mg/ft². The film weights were measured after thorough air drying over several days.

TABLE 1

Coating formulations for Examples C1 and A1 to A4.

| | Example | | | | |
|---|---|---|---|---|---|
| | C1 | A1 | A2 | A3 | A4 |
| Component | Parts by Weight | | | | |
| Resin A | 39.99 | 39.97 | 39.89 | 39.79 | 39.59 |
| Resin B | 51.23 | 51.20 | 51.11 | 50.97 | 50.71 |
| Acid Generator A | 2.57 | 2.57 | 2.56 | 2.56 | 2.55 |
| IR Dye A | 2.77 | 2.77 | 2.76 | 2.75 | 2.74 |
| Terephthaldehyde | 2.28 | 2.28 | 2.28 | 2.27 | 2.26 |
| Blue Dye A | 0.30 | 0.30 | 0.30 | 0.30 | 0.30 |
| XDSA | 0.86 | 0.86 | 0.86 | 0.86 | 0.85 |
| HMBS | — | 0.05 | 0.24 | 0.50 | 1.00 |

The plates were then imaged on the Creo Trendsetter at 76, 81, 86, 93, 100, 109 and 119 mJ/cm², using an internal solid image pattern (100% exposure). After imaging the plates were heated in a forced air oven at 250° F. for 1 minute, cooled and processed in a mechanical processor using Developer A. The solid density ($D_{max}$) of the remaining coating was then measured using the Gretag densitometer. The results are shown in Table 2 below.

TABLE 2

$D_{max}$ at varied imaging energy density for Examples C1 and A1 to A4.

| | $D_{max}$ at stated imaging energy density (mJ/cm²) | | | | | | |
|---|---|---|---|---|---|---|---|
| Example | 76 | 81 | 86 | 93 | 100 | 109 | 119 |
| C1 | 0.55 | 0.56 | 0.72 | 0.96 | 1.06 | 1.27 | 1.39 |
| A1 | 0.58 | 0.66 | 0.91 | 1.10 | 1.24 | 1.40 | 1.41 |
| A2 | 1.08 | 1.26 | 1.39 | 1.41 | 1.41 | 1.41 | 1.41 |
| A3 | 1.27 | 1.34 | 1.41 | 1.39 | 1.41 | 1.41 | 1.41 |
| A4 | 1.31 | 1.35 | 1.39 | 1.39 | 1.39 | 1.39 | 1.39 |

Table 2 shows that addition of sulfonic acid reduces the amount of imaging energy required to achieve an exposed negative working coating.

Further, plate samples of Examples C1 and A1 to A4 were aged in an environmental cabinet (80% RH, 104° F.) for 5 and 10 days prior to imaging, pre-heating and processing. After processing these aged plates were also read via the Gretag densitometer. The results are summarized in Table 3.

TABLE 3

$D_{max}$ at varied imaging energy density for aged plates from Examples C1 and A1 to A4.

| | $D_{max}$ at stated imaging energy density (mJ/cm²) | | | | | | |
|---|---|---|---|---|---|---|---|
| Example | 76 | 81 | 86 | 93 | 100 | 109 | 119 |
| Aged 5 days | | | | | | | |
| C1 | 0.84 | 1.10 | 1.32 | 1.42 | 1.45 | 1.44 | 1.44 |
| A1 | 1.08 | 1.29 | 1.37 | 1.46 | 1.46 | 1.48 | 1.46 |
| A2 | 1.15 | 1.36 | 1.50 | 1.53 | 1.53 | 1.52 | 1.54 |
| A3 | 1.45 | 1.51 | 1.52 | 1.53 | 1.53 | 1.52 | 1.52 |
| Aged 10 days | | | | | | | |
| C1 | 0.77 | 1.11 | 1.39 | 1.47 | 1.51 | 1.51 | 1.51 |
| A1 | 1.08 | 1.36 | 1.49 | 1.51 | 1.51 | 1.55 | 1.56 |
| A2 | 1.16 | 1.35 | 1.42 | 1.43 | 1.51 | 1.51 | 1.53 |
| A3 | 1.47 | 1.54 | 1.52 | 1.50 | 1.53 | 1.52 | 1.50 |
| A4 | 1.36 | 1.49 | 1.54 | 1.55 | 1.53 | 1.53 | 1.53 |

Table 3 shows that the presence of the sulfonic acid does not affect the characteristic aging of the plates. The addition of sulfonic acid continues to reduce the amount of imaging energy required to achieve an exposed negative working coating with aged plates.

The effect of the sulfonic acid on the pre-heating latitude of the plate system, was investigated using plate samples from Examples C1 and A1. The plates were imaged on the Creo Trendsetter as described above. After imaging, the plates were heated in a forced air oven at 245°, 250°, 255°, 260°, 265° and 270° F. for 1 minute, cooled and processed as previously described. The solid density ($D_{max}$) of the remaining coating was then measured using the Gretag densitometer. The results can be seen in Table 4 below.

TABLE 4

Evaluation of pre-heat latitude for Examples C1 and A1.

| | $D_{max}$ at stated imaging energy density (mJ/cm²) | | | | | | |
|---|---|---|---|---|---|---|---|
| | 76 | 81 | 86 | 93 | 100 | 109 | 119 |
| Pre-heat = 245 F. | | | | | | | |
| C1 | 0.61 | 0.62 | 0.63 | 0.69 | 0.89 | 1.07 | 1.33 |
| A1 | 0.68 | 0.84 | 1.11 | 1.19 | 1.35 | 1.39 | 1.45 |
| Pre-heat = 250 F. | | | | | | | |
| C1 | 0.61 | 0.63 | 0.65 | 0.65 | 1.04 | 1.34 | 1.50 |
| A1 | 0.75 | 1.13 | 1.23 | 1.37 | 1.49 | 1.55 | 1.57 |
| Pre-heat = 255 F. | | | | | | | |
| C1 | 0.64 | 0.69 | 0.81 | 0.95 | 1.19 | 1.39 | 1.47 |
| A1 | 1.08 | 1.32 | 1.44 | 1.51 | 1.54 | 1.55 | 1.55 |
| Pre-heat = 260 F. | | | | | | | |
| C1 | 0.75 | 0.9 | 1.05 | 1.18 | 1.34 | 1.43 | 1.47 |
| A1 | 1.16 | 1.31 | 1.45 | 1.48 | 1.52 | 1.54 | 1.56 |
| Pre-heat = 265 F. | | | | | | | |
| C1 | 1.07 | 1.17 | 1.33 | 1.35 | 1.41 | 1.43 | 1.45 |
| A1 | 1.44 | 1.47 | 1.53 | 1.55 | 1.55 | 1.57 | 1.58 |
| Pre-heat = 270 F. | | | | | | | |
| C1 | 1.36 | 1.42 | 1.47 | 1.52 | 1.54 | 1.57 | 1.56 |
| A1 | 1.44 | 1.48 | 1.50 | 1.51 | 1.53 | 1.53 | 1.53 |

Table 4 shows that for a given imaging energy density, the presence of the sulfonic acid allows maximum image density at lower pre-heat temperatures.

Comparative Example C2 and Examples B1 and B2

Coating formulations comprised solutions of the components described in Table 5 in 1-methoxypropan-2-ol/acetone 92:8 (w:w). Plates were prepared by coating the formulations onto the aluminum substrate by means of a whirl coater. The formulation concentrations were selected to provide dry films having a coating weight of 120 mg/ft². The coated plates were dried at 100° C. for 90 seconds. The film weights were measured after thorough air drying over several days.

TABLE 5

Coating formulations for Examples C2, B1 and B2.

| | Example | | |
|---|---|---|---|
| | C2 | B1 | B2 |
| | Parts by Weight | | |
| Resin A | 28.2 | 28.2 | 28.0 |
| Resin C | 48.3 | 48.3 | 47.9 |
| Acid Generator A | 7.5 | 7.5 | 7.4 |
| IR Dye A | 8.6 | 8.6 | 8.5 |
| Terephthaldehyde | 6.5 | 6.5 | 6.4 |
| Blue Dye A | 0.9 | — | 0.9 |
| Blue Dye B | — | 0.9 | 0.9 |

Ascertaining Fog Point:

Unimaged plate samples were placed in a heavy duty Wisconsin oven (conveyor speed=2.5 feet/min) starting at a temperature of 275° F. and decreasing by 5° F. intervals. After processing in a Mercury Mark V processor (containing Developer B at 25° C., processing speed 740 mm/min) the plates were visually appraised for any remaining green coating. The point at which the plates became completely free of coating was noted. In this case, this was 268° F. for all examples.

Thermal Exposure:

Additional plate samples were then imaged on the Creo Trendsetter at 54, 63, 76, 95, 127 and 190 mJ/cm², using an internal solid image pattern (100% exposure). They were then pre-heated in the Wisconsin oven as above, at 258° F. (10° F. below fog point), and processed in the Mercury processor as above. The completed plates were assessed in two ways:

(a) the solid density ($D_{max}$) of the thermally exposed, pre-heated and developed coating was measured using an X-Rite 408 Densitometer;

(b) the plates were visually appraised for banding (variations in the solid coating from dark to light green caused by incomplete cross-linking of the coating during pre-heating).

Results:

Table 6 shows the presence of D11 dye reduces the amount of imaging energy required to produce an exposed negative working coating. The results are expressed graphically in FIG. 1. Table 7 shows the presence of D11 dye, increases the resistance to banding.

TABLE 6

$D_{max}$ at varied imaging energy density for Examples C2, B1 and B2.

| | $D_{max}$ at stated imaging energy density (mJ/cm²) | | | | | |
|---|---|---|---|---|---|---|
| Example | 54 | 63 | 76 | 95 | 127 | 190 |
| C2 | 0.38 | 0.44 | 0.70 | 0.91 | 0.90 | 0.86 |
| B1 | 0.51 | 0.79 | 0.90 | 0.90 | 0.85 | 0.83 |
| B2 | 0.40 | 0.55 | 0.84 | 0.90 | 0.89 | 0.85 |

TABLE 7

Presence of banding at varied imaging energy density for Examples C2, B1 and B2.

| | Presence of banding | | | | | |
|---|---|---|---|---|---|---|
| Example | 54 | 63 | 76 | 95 | 127 | 190 |
| C2 | yes | yes | yes | yes | no | no |
| B1 | yes | yes | no | no | no | no |
| B2 | yes | yes | yes | no | no | no |

Comparative Example C3 and Example B3

Coating formulations comprised solutions of the components described in Table 8 in 1-methoxypropan-2-ol/acetone 92:8 (w:w).

TABLE 8

Coating formulations for Examples C3 and B3.

| | Example | |
|---|---|---|
| | C3 | B3 |
| | Parts by Weight | |
| Resin A | 28.6 | 28.6 |
| Resin C | 48.4 | 48.4 |
| Acid Generator A | 7.5 | 7.5 |
| IR Dye A | 7.8 | 7.8 |
| Terephthaldehyde | 6.5 | 6.5 |
| Blue Dye A | 1.2 | — |
| Blue Dye B | — | 1.2 |

Plates were prepared by coating the formulations onto the aluminum substrate by means of a whirl coater. The formulation concentrations were selected to provide dry films having a coating weight of 120 mg/ft². The coated plates were dried at 100° C. for 90 seconds. The film weights were measured after thorough air drying over several days.

Ascertaining Fog Point:

Unimaged plate samples were placed in a heavy duty Wisconsin oven (conveyor speed=2.5 feet/min) starting at a temperature of 275° F. and decreasing by 5° F. intervals. After processing in a Mercury Mark V processor (containing Developer B at 25° C., processing speed 740 mm/min) the plates were visually appraised for any remaining green coating. The point at which the plates became completely free of coating was noted. In this case, this was 279° F. for Example C3 and 271° F. for Example B3.

Thermal Exposure:

Additional plate samples were then imaged on the Creo Trendsetter at 74, 79, 84, 90, 95, 100, 105, 111, 116, 121, 126, 132, 137, 142, 148, 153, 158 and 163 mJ/cm$^2$, using an internal solid image pattern (100% exposure). They were then pre-heated in the Wisconsin oven as above, at 2°, 7°, 12°, 17° and 22° F. below the relevant fog point, and were processed in the Mercury processor as above.

The completed plates were assessed for banding (Table 9). It can be seen that the presence of D11 dye increases the resistance to banding.

TABLE 9

Presence of banding at varied imaging energy density and varied pre-heat temperature for Examples C3 and B3.

| Imaging Energy Density mJ/cm$^2$ | 2° F. below fog | | 7° F. below fog | | 12° F. below fog | | 17° F. below fog | | 22° F. below fog | |
|---|---|---|---|---|---|---|---|---|---|---|
| | C3 | B3 | C3 | B3 | C3 | B3 | C3 | B3 | C3 | B3 |
| 74 | Yes | Slight | Yes | Yes | Yes | Yes | Yes | Yes | Yes | Yes |
| 79 | Yes | No | Yes | slight | Yes | Yes | Yes | Yes | Yes | Yes |
| 84 | Yes | No | Yes | No | Yes | Slight | Yes | Yes | Yes | Yes |
| 90 | Yes | No | Yes | No | Yes | No | Yes | Yes | Yes | Yes |
| 95 | Yes | No | Yes | No | Yes | No | Yes | No | Yes | Slight |
| 100 | Slight | No | Yes | No | Yes | No | Yes | No | Yes | Slight |
| 105 | No | No | Slight | No | Yes | No | Yes | No | Yes | Slight |
| 111 | No | No | No | No | Yes | No | Yes | No | Yes | No |
| 116 | No | No | No | No | Slight | No | Slight | No | Yes | No |
| 121 | No | No | No | No | No | No | Slight | No | Yes | No |
| 126 | No | No | No | No | No | No | Slight | No | Yes | No |
| 132 | No | No | No | No | No | No | Slight | No | Yes | No |
| 137 | No | No | No | No | No | No | Slight | No | Yes | No |
| 142 | No | No | No | No | No | No | Slight | No | Yes | No |
| 148 | No | No | No | No | No | No | Slight | No | Yes | No |
| 153 | No | No | No | No | No | No | Slight | No | Yes | No |
| 158 | No | No | No | No | No | No | No | No | Yes | No |
| 163 | No | No | No | No | No | No | No | No | Slight | No |

Examples B4 to B8

Coating formulations comprised solutions of the components described in Table 10 in 1-methoxypropan-2-ol/acetone 92:8 (w:w). Plates were prepared by coating the formulations onto the aluminum substrate by means of a whirl coater. The formulation concentrations were selected to provide dry films having a coating weight of 120 mg/ft$^2$. The coated plates were dried at 100° C. for 90 seconds. The film weights were measured after thorough air drying over several days.

TABLE 10

Coating formulations for Examples B4 to B8.

| | Example | | | | |
|---|---|---|---|---|---|
| | B4 | B5 | B6 | B7 | B8 |
| | Parts by Weight | | | | |
| Resin A | 28.48 | 28.47 | 28.44 | 28.42 | 28.41 |
| Resin C | 48.60 | 48.55 | 48.51 | 48.49 | 48.46 |
| Acid Generator A | 7.54 | 7.53 | 7.53 | 7.52 | 7.52 |
| IR Dye A | 7.88 | 7.87 | 7.86 | 7.86 | 7.85 |
| Terephthaldehyde | 6.54 | 6.53 | 6.52 | 6.52 | 6.52 |
| Blue Dye B | 0.96 | 1.05 | 1.14 | 1.19 | 1.24 |

Thermal Exposure:

Plate samples were then imaged on the Creo Trendsetter at 55, 64, 77, 96, 129 and 194 mJ/cm$^2$, using an internal solid image pattern (100% exposure). They were then pre-heated in the heavy duty Wisconsin oven (conveyor speed=2.5 feet/min), at a temperature of 260° F. After processing in a Mercury Mark V processor (containing Developer B at 25° C., processing speed 740 mm/min), the solid. density ($D_{max}$) of the thermally exposed, pre-heated and developed plates was measured using an X-Rite 408 Densitometer.

Table 11 shows increasing amounts of D11 dye, increase the $D_{max}$ of the coating (i.e., the plate has a faster imaging speed).

TABLE 11

$D_{max}$ at varied imaging energy density for Examples B4 to B8.

| | $D_{max}$ at stated imaging energy density (mJ/cm$^2$) | | | | | |
|---|---|---|---|---|---|---|
| Example | 55 | 64 | 77 | 96 | 129 | 194 |
| B4 | 0.39 | 0.72 | 0.87 | 0.87 | 0.85 | 0.82 |
| B5 | 0.39 | 0.72 | 0.87 | 0.88 | 0.87 | 0.84 |
| B6 | 0.42 | 0.75 | 0.96 | 0.94 | 0.92 | 0.89 |
| B7 | 0.48 | 0.72 | 0.92 | 0.91 | 0.89 | 0.89 |
| B8 | 0.48 | 0.75 | 0.92 | 0.95 | 0.95 | 0.89 |

What is claimed is:

1. An imageable composition comprising:
    an acid curable composition;
    an acid generator;
    an infrared absorber having a counter anion derived from a non-volatile acid; and
    a sulfonic acid having a pKa of not more than about 8.

2. The composition of claim 1, wherein the acid curable composition comprises:
    a crosslinkable binder; and
    a crosslinking agent.

3. The composition of claim 2, wherein the binder comprises a polymer having at least two reactive groups each independently selected from the group consisting of: hydroxy, carboxylic acid, amine, carbamate, amide, sulfonamide and imide.

4. The composition of claim 2, wherein the binder comprises a polymer having at least two reactive hydroxy groups.

5. The composition of claim 2, wherein the binder comprises a polymer selected from the group consisting of: a polyol, a polyether polyol, a novolak resin, a resole resin, a hydroxyfunctional acrylic resin, a hydroxyfunctional polyester resin, and combinations thereof.

6. The composition of claim 2, wherein the binder comprises a novolak resin.

7. The composition of claim 2, comprising a crosslinking agent selected from the group consisting of: a resole resin, an amino resin, an amido resin, an epoxy compound having at least two epoxide groups, and combinations thereof.

8. The composition of claim 2, wherein the crosslinking agent comprises a resole resin.

9. The composition of claim 2, wherein the crosslinking agent comprises an amino resin having at least two alkoxymethyl groups.

10. The composition of claim 2, comprising an isocyanate crosslinking agent having at least two isocyanate groups.

11. The composition of claim 1, wherein the acid generator is an ultraviolet, visible or infrared radiation or heat activated compound.

12. The composition of claim 1, comprising an acid generator selected from the group consisting of: an onium salt, a covalently bound sulfonate group-containing compound, hydrocarbylsulfonamido-N-hydrocarbyl sulfonate, and combinations thereof.

13. The composition of claim 1, wherein the acid generator comprises an onium salt.

14. The composition of claim 13, wherein the onium salt has a non-nucleophilic counter anion selected from the group consisting of: tetrafluoroborate, hexafluorophosphate, hexafluoroarsenate, hexafluoroantimonate, triflate, tetrakis (pentafluorophenyl)borate, pentafluoroethyl sulfonate, p-methylbenzene sulfonate, ethyl sulfonate, trifluoromethyl acetate and pentafluoroethyl acetate.

15. The composition of claim 13, wherein the onium salt is selected from the group consisting of: an iodonium salt, a sulfonium salt, a hydrocarbyloxysulfonium salt, a hydrocarbyloxyammonium salt, an aryl diazonium salt, and combinations thereof.

16. The composition of claim 13, wherein the onium salt is a salt of an N-hydrocarbyloxy-substituted nitrogen-containing heterocyclic compound.

17. The composition of claim 1, wherein the acid generator includes a monomeric or oligomeric aromatic diazonium salt.

18. The composition of claim 17, wherein the diazonium salt is selected from the group consisting of: 2-methoxy-4-phenylaminobenzene diazonium hexafluorophosphate, 2-methoxy-4-phenylaminobenzenediazonium p-toluenesulfonate, and combinations thereof.

19. The composition of claim 17, wherein the diazonium salt is an oligomeric diazonium salt represented by one of the structures:

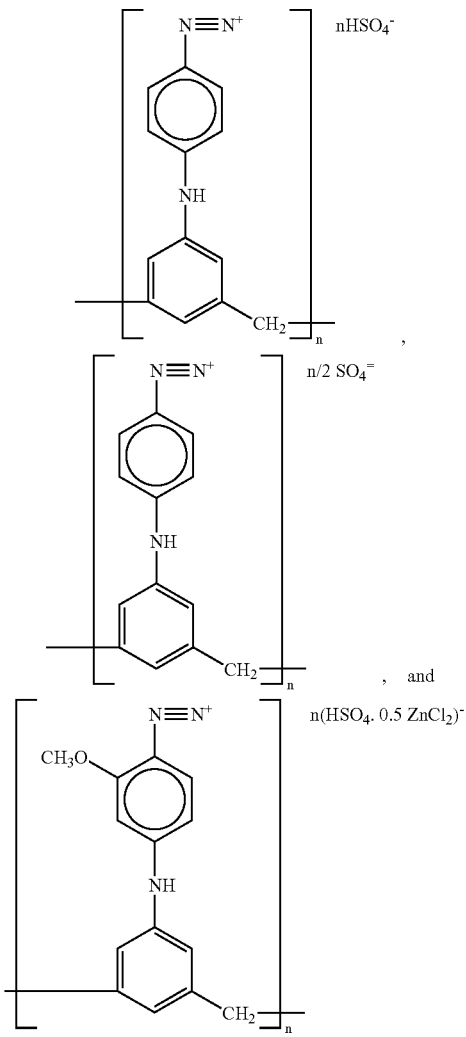

wherein n is from 1 to 11, and combinations thereof.

20. The composition of claim 1, wherein the infrared absorber includes an infrared-absorbing dye selected from the group consisting of: cyanine dyes, squarylium dyes, pyrylium salts and nickel thiolate complexes.

21. The composition of claim 20, wherein the infrared-absorbing dye includes a counter anion derived from a non-volatile sulfonic acid.

22. The composition of claim 20 wherein the infrared-absorbing dye is represented by the structure:

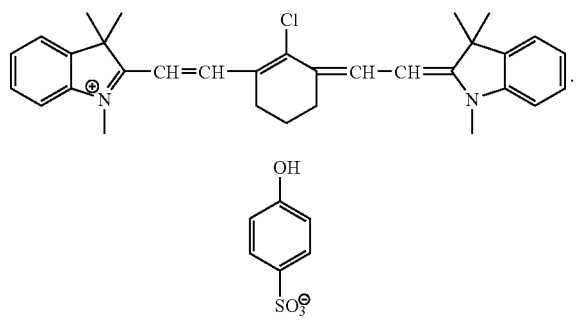

23. The composition of claim 20, wherein the infrared-absorbing dye is represented by the structure:

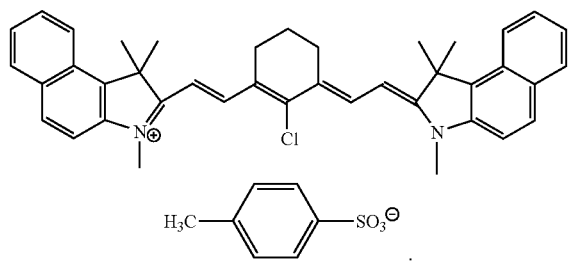

24. The composition of claim 1, wherein the sulfonic acid is represented by the formula R—SO$_3$H, wherein R is a substituted or unsubstituted hydrocarbyl of 1 to 22 carbon atoms, or a substituted or unsubstituted aryl of 6 to 22 carbon atoms.

25. The composition of claim 24, wherein R is selected from the group consisting of: linear, branched or cyclic alkyl of 1 to 22 carbon atom, linear, branched or cyclic haloalkyl of 1 to 22 carbon atom having at least one halogen and a mixture thereof.

26. The composition of claim 1, wherein the sulfonic acid is an acid having a pKa of not more than about 5.

27. The composition of claim 1, wherein the sulfonic acid is an acid having a pKa of not more than about 4.

28. The composition of claim 1, wherein the sulfonic acid is an aryl sulfonic acid represented by the formula:

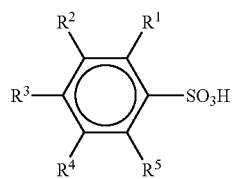

wherein each of R$^1$, R$^2$, R$^3$, R$^4$ and R$^5$ is independently selected from the group consisting of: hydrogen, alkyl of 1 to 12 carbon atoms, haloalkyl of 1 to 22 carbon atoms having at least one halogen, aryl of 6 to 12 carbon atoms, halogen, hydroxy, alkoxy, cyano, nitro, alkoxycarbonyl and acyl.

29. The composition of claim 28, wherein the acyl is represented by the formula:

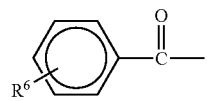

wherein R$^6$ is selected from the group consisting of: hydrogen, alkyl of 1 to 12 carbon atoms, haloalkyl of 1 to 12 carbon atoms having at least one halogen, alkoxy, cyano, nitro, alkoxycarbonyl and acetyl.

30. The composition of claim 1, wherein the sulfonic acid is represented by the formula:

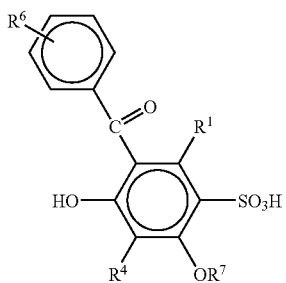

wherein each of R$^1$, R$^4$ and R$^6$ is independently selected from the group consisting of: hydrogen, alkyl of 1 to 12 carbon atoms, haloalkyl of 1 to 12 carbon atoms having at least one halogen, aryl of 6 to 12 carbon atoms, halogen, hydroxy, alkoxy, cyano, nitro, alkoxycarbonyl and acyl and wherein R$^7$ is selected from the group consisting of: hydrogen, alkyl of 1 to 12 carbon atoms, haloalkyl of 1 to 12 carbon atoms having at least one halogen, aryl of 6 to 12 carbon atoms, alkoxycarbonyl and acyl.

31. The composition of claim 1, wherein the sulfonic acid is 3-benzoyl-4-hydroxy-6-methoxybenzenesulfonic acid.

32. The composition of claim 1, wherein the composition further includes a colorant having a counter anion derived from a non-volatile acid.

33. The composition of claim 32, wherein the colorant includes a counter anion derived from a non-volatile sulfonic acid.

34. The composition of claim 32, wherein the colorant includes a compound represented by the structure:

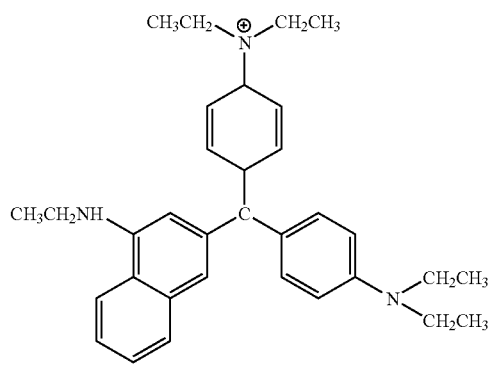

-continued

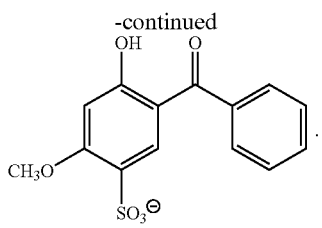

35. An imageable element comprising:
a substrate; and
an imageable coating on a surface of the substrate, the coating comprising: an acid curable composition, an acid generator, an infrared absorber having a counter anion derived from a non-volatile acid, and a sulfonic acid having a pKa of not more than about 8.

36. The imageable element of claim 35, wherein the substrate is an aluminum sheet.

37. The imageable element of claim 35, wherein the acid curable composition comprises:
a crosslinkable binder; and
a crosslinking agent.

38. The imageable element of claim 37, wherein the binder comprises a polymer having at least two reactive hydroxy groups.

39. The imageable element of claim 37, wherein the binder comprises a polymer selected from the group consisting of: a polyol, a polyether polyol, a novolak resin, a resole resin, a hydroxyfunctional acrylic resin, a hydroxy-functional polyester resin, and combinations thereof.

40. The imageable element of claim 37, wherein the binder comprises a novolak resin.

41. The imageable element of claim 37, comprising a crosslinking agent selected from the group consisting of: a resole resin, an amino resin, an amido resin, an epoxy compound having at least two epoxide groups, and combinations thereof.

42. The imageable element of claim 37, wherein the crosslinking agent comprises a resole resin.

43. The imageable element of claim 35, wherein the acid generator is an ultraviolet, visible or infrared radiation or heat activated compound.

44. The imageable element of claim 35, wherein the acid generator comprises an onium salt.

45. The imageable element of claim 44, wherein the onium salt is selected from the group consisting of: an iodonium salt, a sulfonium salt, a hydrocarbyloxysulfonium salt, a hydrocarbyloxyammonium salt, an aryl diazonium salt, and combinations thereof.

46. The imageable element of claim 35, wherein the acid generator includes a monomeric or oligomeric aromatic diazonium salt.

47. The imageable element of claim 35, wherein the infrared absorber includes an infrared-absorbing dye selected from the group consisting of: cyanine dyes, squarylium dyes, pyrylium salts and nickel thiolate complexes.

48. The imageable element of claim 35, wherein the imageable coating further includes a colorant having a counter anion derived from a non-volatile acid.

49. The imageable element of claim 48, wherein the colorant includes a counter anion derived from a non-volatile sulfonic acid.

50. The imageable element of claim 48, wherein the colorant includes a compound represented by the structure:

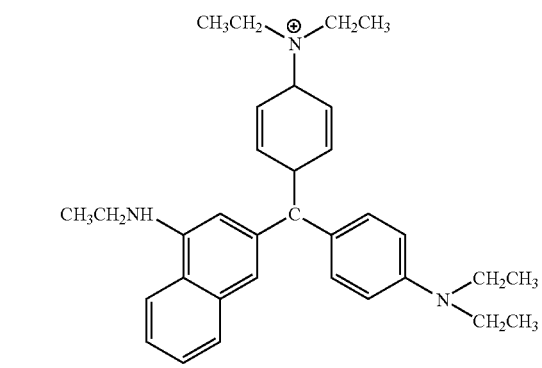

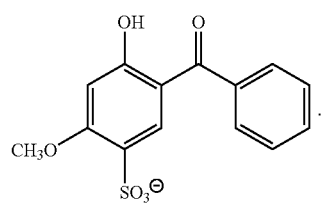

51. The imageable element of claim 35, wherein the sulfonic acid is represented by the formula R—SO$_3$H, wherein R is a substituted or unsubstituted hydrocarbyl of 1 to 22 carbon atoms, or a substituted or unsubstituted aryl of 6 to 22 carbon atoms.

52. The imageable element of claim 51, wherein R is selected from the group consisting of: linear, branched or cyclic alkyl of 1 to 22 carbon atom, linear, branched or cyclic haloalkyl of 1 to 22 carbon atom having at least one halogen and a mixture thereof.

53. The imageable element of claim 35, wherein the sulfonic acid is an acid having a pKa of not more than about 5.

54. The imageable element of claim 35, wherein the sulfonic acid is an acid having a pKa of not more than about 4.

55. The imageable element of claim 35, wherein the sulfonic acid is an aryl sulfonic acid represented by the formula:

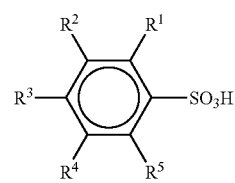

wherein each of $R^1$, $R^2$, $R^3$, $R^4$ and $R^5$ is independently selected from the group consisting of: hydrogen, alkyl of 1 to 12 carbon atoms, haloalkyl of 1 to 22 carbon atoms having at least one halogen, aryl of 6 to 12 carbon atoms, halogen, hydroxy, alkoxy, cyano, nitro, alkoxycarbonyl and acyl.

56. The imageable element of claim 55, wherein the acyl is represented by the formula:

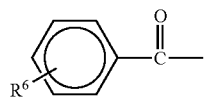

wherein $R^6$ is selected from the group consisting of: hydrogen, alkyl of 1 to 12 carbon atoms, haloalkyl of 1 to 12 carbon atoms having at least one halogen, alkoxy, cyano, nitro, alkoxycarbonyl and acetyl.

57. The imageable element of claim 35, wherein the sulfonic acid is represented by the formula:

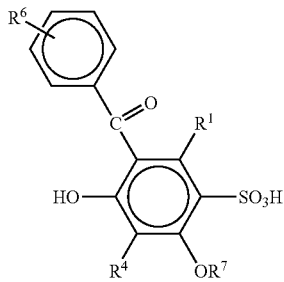

wherein each of $R^1$, $R^4$ and $R^6$ is independently selected from the group consisting of: hydrogen, alkyl of 1 to 12 carbon atoms, haloalkyl of 1 to 12 carbon atoms having at least one halogen, aryl of 6 to 12 carbon atoms, halogen, hydroxy, alkoxy, cyano, nitro, alkoxycarbonyl and acyl and wherein $R^7$ is selected from the group consisting of: hydrogen, alkyl of 1 to 12 carbon atoms, haloalkyl of 1 to 12 carbon atoms having at least one halogen, aryl of 6 to 12 carbon atoms, alkoxycarbonyl and acyl.

58. The imageable element of claim 35, wherein the sulfonic acid is 3-benzoyl-4-hydroxy-6-methoxybenzenesulfonic acid.

59. A method of making an imageable element including a substrate and an imageable coating on the substrate, the method comprising the steps of:
   contacting a substrate with an imageable composition dissolved or dispersed in a suitable solvent, wherein the imageable composition comprises an acid curable composition, an acid generator, an infrared absorber having a counter anion derived from a non-volatile acid, and a sulfonic acid having a pKa of not more than about 8; and
   drying to remove solvent, leaving an imageable coating on the substrate.

60. The method of claim 59, wherein the imageable composition further includes a colorant having a counter anion derived from a non-volatile acid.

61. The method of claim 60, wherein the colorant includes a counter anion derived from a non-volatile sulfonic acid.

62. The method of claim 60, wherein the colorant includes a compound represented by the structure:

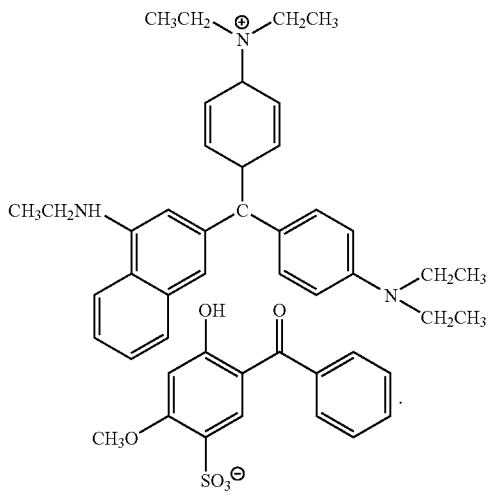

63. A method of producing an imaged element comprising the steps of:
   providing a thermally imageable element comprising a substrate and a thermally imageable coating on a surface of the substrate, the coating comprising an acid curable composition, an acid generator an infrared absorber having a counter anion derived from a non-volatile acid, and a sulfonic acid having a pKa of not more than about 8;
   imagewise exposing the imageable element to radiation to produce an exposed element having exposed and unexposed regions of the coating;
   baking the exposed element at a temperature and period of time sufficient to produce a cured element; and
   contacting the cured element with a developer to remove the unexposed regions of the coating and thereby produce the imaged element.

64. The method of claim 63, wherein the imageable composition further includes a colorant having a counter anion derived from a non-volatile acid.

65. The method of claim 64, wherein the colorant includes a counter anion derived from a non-volatile sulfonic acid.

66. The method of claim 64, wherein the colorant includes a compound represented by the structure:

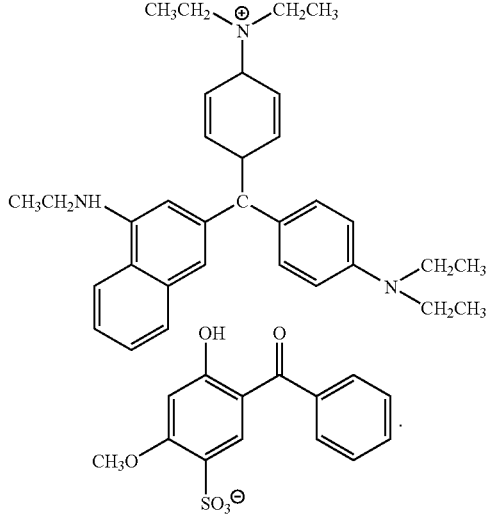

67. The method of claim 63, wherein the step of imagewise exposing is carried out using an infrared laser.

* * * * *